US008829437B2

(12) United States Patent
Prest et al.

(10) Patent No.: US 8,829,437 B2
(45) Date of Patent: Sep. 9, 2014

(54) METHOD FOR QUANTIFYING AMORPHOUS CONTENT IN BULK METALLIC GLASS PARTS USING THERMAL EMISSIVITY

(75) Inventors: Christopher D. Prest, San Francisco, CA (US); Matthew S. Scott, Campbell, CA (US); Dermot J. Stratton, San Francisco, CA (US); Joseph C. Poole, San Francisco, CA (US); Theodore A. Waniuk, Lake Forest, CA (US)

(73) Assignee: Apple Inc., Cupertino, CA (US)

( * ) Notice: Subject to any disclaimer, the term of this patent is extended or adjusted under 35 U.S.C. 154(b) by 252 days.

(21) Appl. No.: 13/541,709

(22) Filed: Jul. 4, 2012

(65) Prior Publication Data
US 2014/0008536 A1    Jan. 9, 2014

(51) Int. Cl.
*G02F 1/01*    (2006.01)
*G01F 23/22*    (2006.01)

(52) U.S. Cl.
CPC ..................................... *G01F 23/22* (2013.01)
USPC .......................................................... 250/330

(58) Field of Classification Search
CPC .......... G01F 23/22; G01F 23/246; G01J 5/10; G01J 5/02; H01L 27/146
USPC .......................................................... 250/330
See application file for complete search history.

(56) References Cited

U.S. PATENT DOCUMENTS

| 5,288,344 | A | 2/1994 | Peker |
| 5,368,659 | A | 11/1994 | Peker |
| 5,618,359 | A | 4/1997 | Lin |
| 5,735,975 | A | 4/1998 | Lin |
| 6,325,868 | B1 | 12/2001 | Kim |
| 7,575,040 | B2 | 8/2009 | Johnson |
| 8,325,987 | B2 * | 12/2012 | Ito et al. .................. 382/106 |
| 2007/0079907 | A1 | 4/2007 | Johnson |
| 2008/0118387 | A1 | 5/2008 | Demetriou |
| 2010/0084052 | A1 | 4/2010 | Farmer |
| 2010/0300148 | A1 | 12/2010 | Demetriou |

FOREIGN PATENT DOCUMENTS

JP    2001-303218    10/2001

OTHER PUBLICATIONS

Inoue et al., "Bulk amorphous alloys with high mechanical strength and good soft magnetic properties in Fe—Tm—B (Tm=IV-VIII group transition metal) system", Appl. Phys. Lett., vol. 71, p. 464 (1997).
Shen ET., "Bulk Glassy CO43FE20TA5,5B31.5 Alloy with High Glass-Forming Ability and Good Soft Magnetic Properties", Materials Transactions, vol. 42 No. 10 (2001) pp. 2136-2139.
Haruyama, O., et al., "Electrical Resistivity Behavior in Pd—Cu—Ni—P Metallic Glasses and Liquids," Mater. Sci. Eng.: A, vol. 375-377, pp. 288-291 (2004).
Olk, et al., "Combinatorial Preparation and Infrared Screening of Hydrogen Sorbing Metal Alloys," J. App. Phys., vol. 94, pp. 720-725 (2003).

* cited by examiner

*Primary Examiner* — Kiho Kim
(74) *Attorney, Agent, or Firm* — Pillsbury Winthrop Shaw Pittman LLP

(57) ABSTRACT

Disclosed are methods and apparatus for determining an unknown degree of amorphicity in a bulk-solidifying amorphous alloy. A specimen can be prepared from the alloy, irradiated with passive radiation, imaged to provide a thermal image, and the image analyzed to assess the differences in emissivities in the image. The degree of amorphicity can be determined based on the differences in thermal emissivities.

18 Claims, 4 Drawing Sheets

US 8,829,437 B2

METHOD FOR QUANTIFYING AMORPHOUS CONTENT IN BULK METALLIC GLASS PARTS USING THERMAL EMISSIVITY

All publications, patents, and patent applications cited in this Specification are hereby incorporated by reference in their entirety.

BACKGROUND

A large portion of the metallic alloys in use today are processed by solidification casting, at least initially. The metallic alloy is melted and cast into a metal or ceramic mold, where it solidifies. The mold is stripped away, and the cast metallic piece is ready for use or further processing. The as-cast structure of most materials produced during solidification and cooling depends upon the cooling rate. There is no general rule for the nature of the variation, but for the most part the structure changes only gradually with changes in cooling rate. On the other hand, for the bulk-solidifying amorphous alloys the change between the amorphous state produced by relatively rapid cooling and the crystalline state produced by relatively slower cooling is one of kind rather than degree—the two states have distinct properties.

Bulk-solidifying amorphous alloys, or bulk metallic glasses ("BMG"), are a recently developed class of metallic materials. These alloys may be solidified and cooled at relatively slow rates, and they retain the amorphous, non-crystalline (i.e., glassy) state at room temperature. This amorphous state can be highly advantageous for certain applications. If the cooling rate is not sufficiently high, crystals may form inside the alloy during cooling, so that the benefits of the amorphous state are lost. For example, one risk with the creation of bulk amorphous alloy parts is partial crystallization due to either slow cooling or impurities in the raw material. Thus, ensuring a high degree of amorphicity (and, conversely, a low degree of crystallinity) can be important in the quality control of a BMG fabrication process.

Currently, the methods to measure the degree of crystallinity can include bending test, x-ray radiography, and etching. These pre-existing techniques are destructive to the measurement specimens. The most common current method for screening relies on either a destructive strength test, or sectioning and subsequent visual screening for crystallization. As a result, for a BMG part (e.g., a casing) that needs to be measured for its degree of crystallinity, it needs to first be significantly altered (e.g., sectioned, published, and/or ground to a powder form).

Thus, a need exists to develop methods that can provide a measurement of the degree of crystallinity (and thus, the amorphous content) of a BMG accurately and automatically, thereby facilitating a more rapid and cost efficient quality control of its fabrication process.

SUMMARY

One embodiment provides a method of determining an unknown degree of amorphicity, the method including preparing a specimen of a bulk-solidifying amorphous alloy; irradiating at least one surface of the specimen with passive radiation; imaging the irradiated surface with an infrared camera or detector to provide a thermal image, or thermogram; evaluating the differences in emissivity in the thermal image; and determining the percentage of amorphous phase based on the differences in emissivity in the thermal image.

Another embodiment provides an apparatus for determining an unknown degree of amorphicity; the apparatus including a specimen preparation mechanism capable of preparing a specimen comprising at least one cross section of a bulk-solidifying amorphous alloy. The apparatus also includes a passive radiation source to passively irradiate at least one surface of the specimen, and an imaging mechanism capable of imaging the irradiated surface and providing a thermal image or thermogram of the irradiated surface. The apparatus further includes an analyzer that analyzes the thermal image to evaluate the differences in emissivity in the thermal image and determines the percentage of amorphicity based on the differences in emissivity in the thermal image.

DETAILED DESCRIPTION

All publications, patents, and patent applications cited in this Specification are hereby incorporated by reference in their entirety.

The articles "a" and "an" are used herein to refer to one or to more than one (i.e., to at least one) of the grammatical object of the article. By way of example, "a polymer resin" means one polymer resin or more than one polymer resin. Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Bulk-solidifying amorphous alloys, or bulk metallic glasses ("BMG"), are a recently developed class of metallic materials. These alloys may be solidified and cooled at relatively slow rates, and they retain the amorphous, non-crystalline (i.e., glassy) state at room temperature. Amorphous alloys have many superior properties than their crystalline counterparts. However, if the cooling rate is not sufficiently high, crystals may form inside the alloy during cooling, so that the benefits of the amorphous state can be lost. For example, one challenge with the fabrication of bulk amorphous alloy parts is partial crystallization of the parts due to either slow cooling or impurities in the raw alloy material. As a high degree of amorphicity (and, conversely, a low degree of crystallinity) is desirable in BMG parts, there is a need to develop methods for casting BMG parts having controlled amount of amorphicity.

Figure 1:
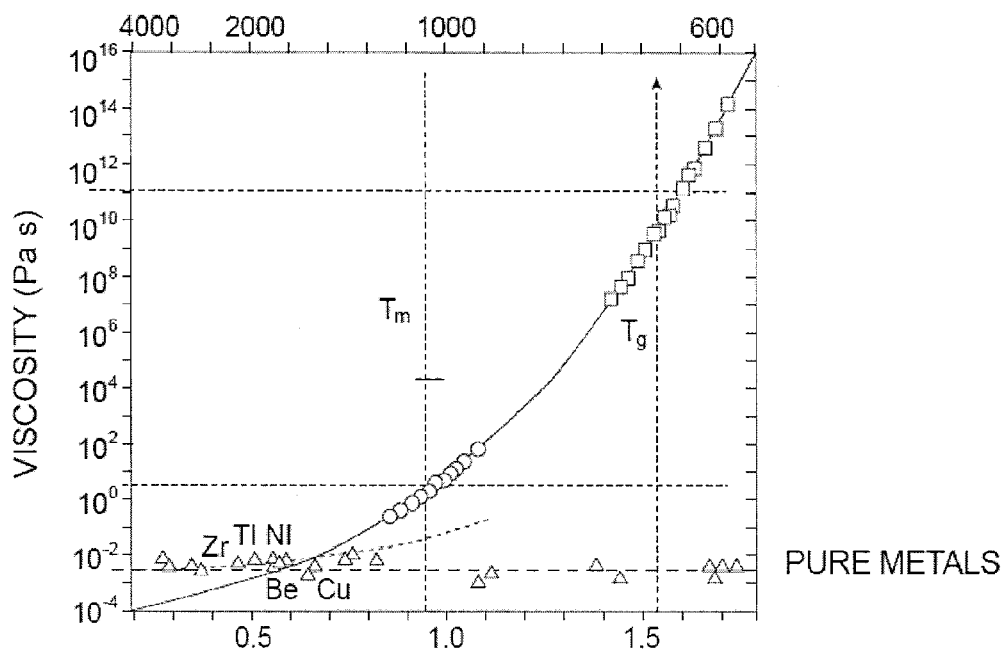
FIG. 1 provides a temperature-viscosity diagram of an exemplary bulk solidifying amorphous alloy.

FIG. 1 (obtained from U.S. Pat. No. 7,575,040) shows a viscosity-temperature graph of an exemplary bulk solidifying amorphous alloy, from the VIT-001 series of Zr—Ti—Ni—Cu—Be family manufactured by Liquidmetal Technology. It should be noted that there is no clear liquid/solid transformation for a bulk solidifying amorphous metal during the formation of an amorphous solid. The molten alloy becomes more and more viscous with increasing undercooling until it approaches solid form around the glass transition temperature. Accordingly, the temperature of solidification front for bulk solidifying amorphous alloys can be around glass transition temperature, where the alloy will practically act as a solid for the purposes of pulling out the quenched amorphous sheet product.

Figure 2:
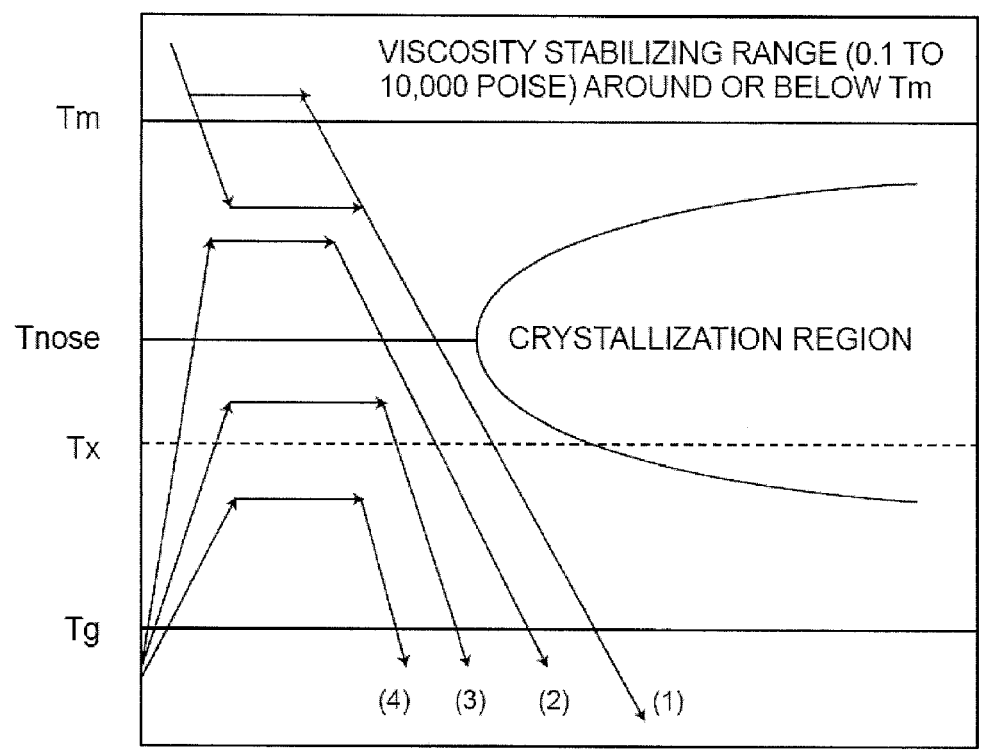
FIG. 2 provides a schematic of a time-temperature-transformation (TTT) diagram for an exemplary bulk solidifying amorphous alloy.

FIG. 2 (obtained from U.S. Pat. No. 7,575,040) shows the time-temperature-transformation (TTT) cooling curve of an exemplary bulk solidifying amorphous alloy, or TTT diagram. Bulk-solidifying amorphous metals do not experience a liquid/solid crystallization transformation upon cooling, as with conventional metals. Instead, the highly fluid, non crystalline form of the metal found at high temperatures (near a "melting temperature" Tm) becomes more viscous as the temperature is reduced (near to the glass transition temperature Tg), eventually taking on the outward physical properties of a conventional solid.

Even though there is no liquid/crystallization transformation for a bulk solidifying amorphous metal, a "melting temperature" Tm may be defined as the thermodynamic liquidus temperature of the corresponding crystalline phase. Under this regime, the viscosity of bulk-solidifying amorphous alloys at the melting temperature could lie in the range of about 0.1 poise to about 10,000 poise, and even sometimes under 0.01 poise. A lower viscosity at the "melting temperature" would provide faster and complete filling of intricate portions of the shell/mold with a bulk solidifying amorphous metal for forming the BMG parts. Furthermore, the cooling rate of the molten metal to form a BMG part has to such that the time-temperature profile during cooling does not traverse through the nose-shaped region bounding the crystallized region in the TTT diagram of FIG. 2. In FIG. 2, Tnose is the critical crystallization temperature Tx where crystallization is most rapid and occurs in the shortest time scale.

The supercooled liquid region, the temperature region between Tg and Tx is a manifestation of the extraordinary stability against crystallization of bulk solidification alloys. In this temperature region the bulk solidifying alloy can exist as a high viscous liquid. The viscosity of the bulk solidifying alloy in the supercooled liquid region can vary between 1012 Pa s at the glass transition temperature down to 105 Pa s at the crystallization temperature, the high temperature limit of the supercooled liquid region. Liquids with such viscosities can undergo substantial plastic strain under an applied pressure. The embodiments herein make use of the large plastic formability in the supercooled liquid region as a forming and separating method.

One needs to clarify something about Tx. Technically, the nose-shaped curve shown in the TTT diagram describes Tx as a function of temperature and time. Thus, regardless of the trajectory that one takes while heating or cooling a metal alloy, when one hits the TTT curve, one has reached Tx. In FIG. 2, Tx is shown as a dashed line as Tx can vary from close to Tm to close to Tg.

The schematic TTT diagram of FIG. 2 shows processing methods of die casting from at or above Tm to below Tg without the time-temperature trajectory (shown as (1) as an example trajectory) hitting the TTT curve. During die casting, the forming takes place substantially simultaneously with fast cooling to avoid the trajectory hitting the TTT curve. The processing methods for superplastic forming (SPF) from at or below Tg to below Tm without the time-temperature trajectory (shown as (2), (3) and (4) as example trajectories) hitting the TTT curve. In SPF, the amorphous BMG is reheated into the supercooled liquid region where the available processing window could be much larger than die casting, resulting in better controllability of the process. The SPF process does not require fast cooling to avoid crystallization during cooling. Also, as shown by example trajectories (2), (3) and (4), the SPF can be carried out with the highest temperature during SPF being above Tnose or below Tnose, up to about Tm. If one heats up a piece of amorphous alloy but manages to avoid hitting the TTT curve, you have heated "between Tg and Tm", but one would have not reached Tx.

Typical differential scanning calorimeter (DSC) heating curves of bulk-solidifying amorphous alloys taken at a heating rate of 20 C/min describe, for the most part, a particular trajectory across the TTT data where one would likely see a Tg at a certain temperature, a Tx when the DSC heating ramp crosses the TTT crystallization onset, and eventually melting peaks when the same trajectory crosses the temperature range for melting. If one heats a bulk-solidifying amorphous alloy at a rapid heating rate as shown by the ramp up portion of trajectories (2), (3) and (4) in FIG. 2, then one could avoid the TTT curve entirely, and the DSC data would show a glass transition but no Tx upon heating. Another way to think about it is trajectories (2), (3) and (4) can fall anywhere in temperature between the nose of the TTT curve (and even above it) and the Tg line, as long as it does not hit the crystallization curve. That just means that the horizontal plateau in trajectories might get much shorter as one increases the processing temperature.

Phase

The term "phase" herein can refer to one that can be found in a thermodynamic phase diagram. A phase is a region of space (e.g., a thermodynamic system) throughout which all physical properties of a material are essentially uniform. Examples of physical properties include density, index of refraction, chemical composition and lattice periodicity. A simple description of a phase is a region of material that is chemically uniform, physically distinct, and/or mechanically separable. For example, in a system consisting of ice and water in a glass jar, the ice cubes are one phase, the water is a second phase, and the humid air over the water is a third phase. The glass of the jar is another separate phase. A phase can refer to a solid solution, which can be a binary, tertiary, quaternary, or more, solution, or a compound, such as an intermetallic compound. As another example, an amorphous phase is distinct from a crystalline phase.

Metal, Transition Metal, and Non-Metal

The term "metal" refers to an electropositive chemical element. The term "element" in this Specification refers generally to an element that can be found in a Periodic Table. Physically, a metal atom in the ground state contains a partially filled band with an empty state close to an occupied state. The term "transition metal" is any of the metallic elements within Groups 3 to 12 in the Periodic Table that have an incomplete inner electron shell and that serve as transitional links between the most and the least electropositive in a series of elements. Transition metals are characterized by multiple valences, colored compounds, and the ability to form stable complex ions. The term "nonmetal" refers to a chemical element that does not have the capacity to lose electrons and form a positive ion.

Depending on the application, any suitable nonmetal elements, or their combinations, can be used. The alloy (or "alloy composition") can comprise multiple nonmetal elements, such as at least two, at least three, at least four, or more, nonmetal elements. A nonmetal element can be any element that is found in Groups 13-17 in the Periodic Table. For example, a nonmetal element can be any one of F, Cl, Br, I, At, O, S, Se, Te, Po, N, P, As, Sb, Bi, C, Si, Ge, Sn, Pb, and B. Occasionally, a nonmetal element can also refer to certain metalloids (e.g., B, Si, Ge, As, Sb, Te, and Po) in Groups 13-17. In one embodiment, the nonmetal elements can include B, Si, C, P, or combinations thereof. Accordingly, for example, the alloy can comprise a boride, a carbide, or both.

A transition metal element can be any of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, meitnerium, ununnilium, unununium, and ununbium. In one embodiment, a BMG containing a transition metal element can have at least one of Sc, Y, La, Ac, Ti, Zr, Hf, V, Nb, Ta, Cr, Mo, W, Mn, Tc, Re, Fe, Ru, Os, Co, Rh, Ir, Ni, Pd, Pt, Cu, Ag, Au, Zn, Cd, and Hg. Depending on the application, any suitable transitional metal elements, or their combinations, can be used. The alloy composition can comprise multiple transitional metal elements, such as at least two, at least three, at least four, or more, transitional metal elements.

The presently described alloy or alloy "sample" or "specimen" alloy can have any shape or size. For example, the alloy can have a shape of a particulate, which can have a shape such as spherical, ellipsoid, wire-like, rod-like, sheet-like, flake-like, or an irregular shape. The particulate can have any size. For example, it can have an average diameter of between about 1 micron and about 100 microns, such as between about 5 microns and about 80 microns, such as between about 10 microns and about 60 microns, such as between about 15 microns and about 50 microns, such as between about 15 microns and about 45 microns, such as between about 20 microns and about 40 microns, such as between about 25 microns and about 35 microns. For example, in one embodiment, the average diameter of the particulate is between about 25 microns and about 44 microns. In some embodiments, smaller particulates, such as those in the nanometer range, or larger particulates, such as those bigger than 100 microns, can be used.

The alloy sample or specimen can also be of a much larger dimension. For example, it can be a bulk structural component, such as an ingot, housing/casing of an electronic device or even a portion of a structural component that has dimensions in the millimeter, centimeter, or meter range.

Solid Solution

The term "solid solution" refers to a solid form of a solution. The term "solution" refers to a mixture of two or more substances, which may be solids, liquids, gases, or a combination of these. The mixture can be homogeneous or heterogeneous. The term "mixture" is a composition of two or more substances that are combined with each other and are generally capable of being separated. Generally, the two or more substances are not chemically combined with each other.

Alloy

In some embodiments, the alloy composition described herein can be fully alloyed. In one embodiment, an "alloy" refers to a homogeneous mixture or solid solution of two or more metals, the atoms of one replacing or occupying interstitial positions between the atoms of the other; for example, brass is an alloy of zinc and copper. An alloy, in contrast to a composite, can refer to a partial or complete solid solution of one or more elements in a metal matrix, such as one or more compounds in a metallic matrix. The term alloy herein can refer to both a complete solid solution alloy that can give single solid phase microstructure and a partial solution that can give two or more phases. An alloy composition described herein can refer to one comprising an alloy or one comprising an alloy-containing composite.

Thus, a fully alloyed alloy can have a homogenous distribution of the constituents, be it a solid solution phase, a compound phase, or both. The term "fully alloyed" used herein can account for minor variations within the error tolerance. For example, it can refer to at least 90% alloyed, such as at least 95% alloyed, such as at least 99% alloyed, such as at least 99.5% alloyed, such as at least 99.9% alloyed. The percentage herein can refer to either volume percent or weight percentage, depending on the context. These percentages can be balanced by impurities, which can be in terms of composition or phases that are not a part of the alloy.

Amorphous or Non-Crystalline Solid

An "amorphous" or "non-crystalline solid" is a solid that lacks lattice periodicity, which is characteristic of a crystal. As used herein, an "amorphous solid" includes "glass" which is an amorphous solid that softens and transforms into a liquid-like state upon heating through the glass transition. Generally, amorphous materials lack the long-range order characteristic of a crystal, though they can possess some short-range order at the atomic length scale due to the nature of chemical bonding. The distinction between amorphous solids and crystalline solids can be made based on lattice periodicity as determined by structural characterization techniques such as x-ray diffraction and transmission electron microscopy.

The terms "order" and "disorder" designate the presence or absence of some symmetry or correlation in a many-particle system. The terms "long-range order" and "short-range order" distinguish order in materials based on length scales.

The strictest form of order in a solid is lattice periodicity: a certain pattern (the arrangement of atoms in a unit cell) is repeated again and again to form a translationally invariant tiling of space. This is the defining property of a crystal. Possible symmetries have been classified in 14 Bravais lattices and 230 space groups.

Lattice periodicity implies long-range order. If only one unit cell is known, then by virtue of the translational symmetry it is possible to accurately predict all atomic positions at arbitrary distances. The converse is generally true, except, for example, in quasi-crystals that have perfectly deterministic tilings but do not possess lattice periodicity.

Long-range order characterizes physical systems in which remote portions of the same sample exhibit correlated behavior. This can be expressed as a correlation function, namely the spin-spin correlation function:

In the above function, s is the spin quantum number and x is the distance function within the particular system. This function is equal to unity when $x=x'$ and decreases as the distance $|x-x'|$ increases. Typically, it decays exponentially to zero at large distances, and the system is considered to be disordered. If, however, the correlation function decays to a constant value at large $|x-x'|$, then the system can be said to possess long-range order. If it decays to zero as a power of the distance, then it can be called quasi-long-range order. Note that what constitutes a large value of $|x-x'|$ is relative.

A system can be said to present quenched disorder when some parameters defining its behavior are random variables that do not evolve with time (i.e., they are quenched or frozen)—e.g., spin glasses. It is opposite to annealed disorder, where the random variables are allowed to evolve themselves. Embodiments herein include systems comprising quenched disorder.

The alloy described herein can be crystalline, partially crystalline, amorphous, or substantially amorphous. For example, the alloy sample/specimen can include at least some crystallinity, with grains/crystals having sizes in the nanometer and/or micrometer ranges. Alternatively, the alloy can be substantially amorphous, such as fully amorphous. In one embodiment, the alloy composition is at least substantially not amorphous, such as being substantially crystalline, such as being entirely crystalline.

In one embodiment, the presence of a crystal or a plurality of crystals in an otherwise amorphous alloy can be construed as a "crystalline phase" therein. The degree of crystallinity (or "crystallinity" for short in some embodiments) of an alloy can refer to the amount of the crystalline phase present in the alloy. The degree can refer to, for example, a fraction of crystals present in the alloy. The fraction can refer to volume fraction or weight fraction, depending on the context. A measure of how "amorphous" an amorphous alloy is can be amorphicity. Amorphicity can be measured in terms of a degree of crystallinity. For example, in one embodiment, an alloy having a low degree of crystallinity can be said to have a high degree of amorphicity. In one embodiment, for example, an alloy having 60 vol % crystalline phase can have a 40 vol % amorphous phase.

Amorphous Alloy or Amorphous Metal

An "amorphous alloy" is an alloy having an amorphous content of more than 50% by volume, preferably more than 90% by volume of amorphous content, more preferably more than 95% by volume of amorphous content, and most preferably more than 99% to almost 100% by volume of amorphous content. Note that, as described above, an alloy high in amorphicity is equivalently low in degree of crystallinity. An "amorphous metal" is an amorphous metal material with a disordered atomic-scale structure. In contrast to most metals, which are crystalline and therefore have a highly ordered arrangement of atoms, amorphous alloys are non-crystalline. Materials in which such a disordered structure is produced directly from the liquid state during cooling are sometimes referred to as "glasses." Accordingly, amorphous metals are commonly referred to as "metallic glasses" or "glassy metals." In one embodiment, a bulk metallic glass ("BMG") can refer to an alloy, of which the microstructure is at least partially amorphous. However, there are several ways besides extremely rapid cooling to produce amorphous metals, including physical vapor deposition, solid-state reaction, ion irradiation, melt spinning, and mechanical alloying. Amorphous alloys can be a single class of materials, regardless of how they are prepared.

Amorphous metals can be produced through a variety of quick-cooling methods. For instance, amorphous metals can be produced by sputtering molten metal onto a spinning metal disk. The rapid cooling, on the order of millions of degrees a second, can be too fast for crystals to form, and the material is thus "locked in" a glassy state. Also, amorphous metals/alloys can be produced with critical cooling rates low enough to allow formation of amorphous structures in thick layers—e.g., bulk metallic glasses.

The terms "bulk metallic glass" ("BMG"), bulk amorphous alloy ("BAA"), and bulk solidifying amorphous alloy are used interchangeably herein. They refer to amorphous alloys having the smallest dimension at least in the millimeter range. For example, the dimension can be at least about 0.5 mm, such as at least about 1 mm, such as at least about 2 mm, such as at least about 4 mm, such as at least about 5 mm, such as at least about 6 mm, such as at least about 8 mm, such as at least about 10 mm, such as at least about 12 mm. Depending on the geometry, the dimension can refer to the diameter, radius, thickness, width, length, etc. A BMG can also be a metallic glass having at least one dimension in the centimeter range, such as at least about 1.0 cm, such as at least about 2.0 cm, such as at least about 5.0 cm, such as at least about 10.0 cm. In some embodiments, a BMG can have at least one dimension at least in the meter range. A BMG can take any of the shapes or forms described above, as related to a metallic glass. Accordingly, a BMG described herein in some embodiments can be different from a thin film made by a conventional deposition technique in one important aspect—the former can be of a much larger dimension than the latter.

Amorphous metals can be an alloy rather than a pure metal. The alloys may contain atoms of significantly different sizes, leading to low free volume (and therefore having viscosity up to orders of magnitude higher than other metals and alloys) in a molten state. The viscosity prevents the atoms from moving enough to form an ordered lattice. The material structure may result in low shrinkage during cooling and resistance to plastic deformation. The absence of grain boundaries, the weak spots of crystalline materials in some cases, may, for example, lead to better resistance to wear and corrosion. In one embodiment, amorphous metals, while technically glasses, may also be much tougher and less brittle than oxide glasses and ceramics.

Thermal conductivity of amorphous materials may be lower than that of their crystalline counterparts. To achieve formation of an amorphous structure even during slower cooling, the alloy may be made of three or more components, leading to complex crystal units with higher potential energy and lower probability of formation. The formation of amorphous alloy can depend on several factors: the composition of the components of the alloy; the atomic radius of the components (preferably with a significant difference of over 12% to achieve high packing density and low free volume); and the negative heat of mixing the combination of components, inhibiting crystal nucleation and prolonging the time the molten metal stays in a supercooled state. However, as the formation of an amorphous alloy is based on many different variables, it can be difficult to make a prior determination of whether an alloy composition would form an amorphous alloy.

Amorphous alloys, for example, of boron, silicon, phosphorus, and other glass formers with magnetic metals (iron, cobalt, nickel) may be magnetic, with low coercivity and high electrical resistance. The high resistance leads to low losses by eddy currents when subjected to alternating magnetic fields, a property useful, for example, as transformer magnetic cores.

Amorphous alloys may have a variety of potentially useful properties. In particular, they tend to be stronger than crystalline alloys of similar chemical composition, and they can sustain larger reversible ("elastic") deformations than crystalline alloys. Amorphous metals derive their strength directly from their non-crystalline structure, which can have none of the defects (such as dislocations) that limit the strength of crystalline alloys. For example, one modern amorphous metal, known as Vitreloy™, has a tensile strength that is almost twice that of high-grade titanium. In some embodiments, metallic glasses at room temperature are not ductile and tend to fail suddenly when loaded in tension, which limits the material applicability in reliability-critical applications, as the impending failure is not evident. Therefore, to overcome this challenge, metal matrix composite materials having a metallic glass matrix containing dendritic particles or fibers of a ductile crystalline metal can be used. Alternatively, a BMG low in element(s) that tend to cause embitterment (e.g., Ni) can be used. For example, a Ni-free BMG can be used to improve the ductility of the BMG.

Another useful property of bulk amorphous alloys is that they can be true glasses; in other words, they can soften and flow upon heating. This can allow for easy processing, such as by injection molding, in much the same way as polymers. As a result, amorphous alloys can be used for making sports equipment, medical devices, electronic components and equipment, and thin films. Thin films of amorphous metals can be deposited as protective coatings via a high velocity oxygen fuel technique.

A material can have an amorphous phase, a crystalline phase, or both. The amorphous and crystalline phases can have the same chemical composition and differ only in the microstructure—i.e., one amorphous and the other crystalline. Microstructure in one embodiment refers to the structure of a material as revealed by a microscope at 25× magnification or higher. Alternatively, the two phases can have different chemical compositions and microstructures. For example, a composition can be partially amorphous, substantially amorphous, or completely amorphous.

As described above, the degree of amorphicity (and conversely the degree of crystallinity) can be measured by fraction of crystals present in the alloy. The degree can refer to volume fraction or weight fraction of the crystalline phase present in the alloy. A partially amorphous composition can refer to a composition of at least about 5 vol % of which is of an amorphous phase, such as at least about 10 vol %, such as at least about 20 vol %, such as at least about 40 vol %, such as at least about 60 vol %, such as at least about 80 vol %, such as at least about 90 vol %. The terms "substantially" and "about" have been defined elsewhere in this application. Accordingly, a composition that is at least substantially amorphous can refer to one of which at least about 90 vol % is amorphous, such as at least about 95 vol %, such as at least about 98 vol %, such as at least about 99 vol %, such as at least about 99.5 vol %, such as at least about 99.8 vol %, such as at least about 99.9 vol %. In one embodiment, a substantially amorphous composition can have some incidental, insignificant amount of crystalline phase present therein.

In one embodiment, an amorphous alloy composition can be homogeneous with respect to the amorphous phase. A substance that is uniform in composition is homogeneous. This is in contrast to a substance that is heterogeneous. The term "composition" refers to the chemical composition and/or microstructure in the substance. A substance is homogeneous when a volume of the substance is divided in half and both halves have substantially the same composition. For example, a particulate suspension is homogeneous when a volume of the particulate suspension is divided in half and both halves have substantially the same volume of particles. However, it might be possible to see the individual particles under a microscope. Another example of a homogeneous substance is air where different ingredients therein are equally suspended, though the particles, gases and liquids in air can be analyzed separately or separated from air.

A composition that is homogeneous with respect to an amorphous alloy can refer to one having an amorphous phase substantially uniformly distributed throughout its microstructure. In other words, the composition macroscopically comprises a substantially uniformly distributed amorphous alloy throughout the composition. In an alternative embodiment, the composition can be of a composite, having an amorphous phase having therein a non-amorphous phase. The non-amorphous phase can be a crystal or a plurality of crystals. The crystals can be in the form of particulates of any shape, such as spherical, ellipsoid, wire-like, rod-like, sheet-like, flake-like, or an irregular shape. In one embodiment, it can have a dendritic form. For example, an at least partially amorphous composite composition can have a crystalline phase in the shape of dendrites dispersed in an amorphous phase matrix; the dispersion can be uniform or non-uniform, and the amorphous phase and the crystalline phase can have the same or a different chemical composition. In one embodiment, they have substantially the same chemical composition. In another embodiment, the crystalline phase can be more ductile than the BMG phase.

The methods described herein can be applicable to any type of amorphous alloy. Similarly, the amorphous alloy described herein as a constituent of a composition or article can be of any type. The amorphous alloy can comprise the element Zr, Hf, Ti, Cu, Ni, Pt, Pd, Fe, Mg, Au, La, Ag, Al, Mo, Nb, Be, or combinations thereof. Namely, the alloy can include any combination of these elements in its chemical formula or chemical composition. The elements can be present at different weight or volume percentages. For example, an iron "based" alloy can refer to an alloy having a non-insignificant weight percentage of iron present therein, the weight percent can be, for example, at least about 20 wt %, such as at least about 40 wt %, such as at least about 50 wt %, such as at least about 60 wt %, such as at least about 80 wt %. Alternatively, in one embodiment, the above-described percentages can be volume percentages, instead of weight percentages. Accordingly, an amorphous alloy can be zirconium-based, titanium-based, platinum-based, palladium-based, gold-based, silver-based, copper-based, iron-based, nickel-based, aluminum-based, molybdenum-based, and the like. The alloy can also be free of any of the aforementioned elements to suit a particular purpose. For example, in some embodiments, the alloy, or the composition including the alloy, can be substantially free of nickel, aluminum, titanium, beryllium, or combinations thereof. In one embodiment, the alloy or the composite is completely free of nickel, aluminum, titanium, beryllium, or combinations thereof.

For example, the amorphous alloy can have the formula $(Zr, Ti)_a(Ni, Cu, Fe)_b(Be, Al, Si, B)_c$, wherein a, b, and c each represents a weight or atomic percentage. In one embodiment, a is in the range of from 30 to 75, b is in the range of from 5 to 60, and c is in the range of from 0 to 50 in atomic percentages. Alternatively, the amorphous alloy can have the formula $(Zr, Ti)_a(Ni, Cu)_b(Be)_c$, wherein a, b, and c each represents a weight or atomic percentage. In one embodiment, a is in the range of from 40 to 75, b is in the range of from 5 to 50, and c is in the range of from 5 to 50 in atomic percentages. The alloy can also have the formula $(Zr, Ti)_a(Ni, Cu)_b(Be)_c$, wherein a, b, and c each represents a weight or atomic percentage. In one embodiment, a is in the range of from 45 to 65, b is in the range of from 7.5 to 35, and c is in the range of from 10 to 37.5 in atomic percentages. Alternatively, the alloy can have the formula $(Zr)_a(Nb, Ti)_b(Ni, Cu)_c(Al)_d$, wherein a, b, c, and d each represents a weight or atomic percentage. In one embodiment, a is in the range of from 45 to 65, b is in the range of from 0 to 10, c is in the range of from 20 to 40 and d is in the range of from 7.5 to 15 in atomic percentages. One exemplary embodiment of the afore-described alloy system is a Zr—Ti—Ni—Cu—Be based amorphous alloy under the trade name Vitreloy™, such as Vitreloy-1 and Vitreloy-101, as fabricated by Liquidmetal Technologies, CA, USA. Some examples of amorphous alloys of the different systems are provided in Table 1 and Table 2.

TABLE 1

Exemplary amorphous alloy compositions

| Alloy | Atm % | Atm % | Atm % | Atm % | Atm % | Atm % | Atm % | Atm % |
|---|---|---|---|---|---|---|---|---|
| 1 | Fe 68.00% | Mo 5.00% | Ni 5.00% | Cr 2.00% | P 12.50% | C 5.00% | B 2.50% | |
| 2 | Fe 68.00% | Mo 5.00% | Ni 5.00% | Cr 2.00% | P 11.00% | C 5.00% | B 2.50% | Si 1.50% |
| 3 | Pd 44.48% | Cu 32.35% | Co 4.05% | P 19.11% | | | | |
| 4 | Pd 77.50% | Ag 6.00% | Si 9.00% | P 7.50% | | | | |
| 5 | Pd 79.00% | Ag 3.50% | Si 9.50% | P 6.00% | Ge 2.00% | | | |
| 5 | Pt 74.70% | Cu 1.50% | Ag 0.30% | P 18.0% | B 4.00% | Si 1.50% | | |

TABLE 2

Additional Exemplary amorphous alloy compositions (atomic %)

| Alloy | Atm % | Atm % | Atm % | Atm % | Atm % | Atm % |
|---|---|---|---|---|---|---|
| 1 | Zr 41.20% | Ti 13.80% | Cu 12.50% | Ni 10.00% | Be 22.50% | |
| 2 | Zr 44.00% | Ti 11.00% | Cu 10.00% | Ni 10.00% | Be 25.00% | |
| 3 | Zr 56.25% | Ti 11.25% | Cu 6.88% | Ni 5.63% | Nb 7.50% | Be 12.50% |
| 4 | Zr 64.75% | Ti 5.60% | Cu 14.90% | Ni 11.15% | Al 2.60% | Be 1.00% |
| 5 | Zr 52.50% | Ti 5.00% | Cu 17.90% | Ni 14.60% | Al 10.00% | |
| 6 | Zr 57.00% | Nb 5.00% | Cu 15.40% | Ni 12.60% | Al 10.00% | |
| 7 | Zr 50.75% | Cu 36.23% | Ni 4.03% | Al 9.00% | | |
| 8 | Zr 46.75% | Ti 8.25% | Cu 7.50% | Ni 10.00% | Be 27.50% | |
| 9 | Zr 21.67% | Ti 43.33% | Ni 7.50% | Be 27.50% | | |
| 10 | Zr 35.00% | Ti 30.00% | Cu 7.50% | Be 27.50% | | |
| 11 | Zr 35.00% | Ti 30.00% | Co 6.00% | Be 29.00% | | |
| 12 | Zr 35.00% | Ti 30.00% | Fe 2.00% | Be 33.00% | | |
| 13 | Au 49.00% | Ag 5.50% | Pd 2.30% | Cu 26.90% | Si 16.30% | |
| 14 | Au 50.90% | Ag 3.00% | Pd 2.30% | Cu 27.80% | Si 16.00% | |
| 15 | Pt 57.50% | Cu 14.70% | Ni 5.30% | P 22.50% | | |
| 16 | Zr 36.60% | Ti 31.40% | Nb 7.00% | Cu 5.90% | Be 19.10% | |
| 17 | Zr 38.30% | Ti 32.90% | Nb 7.30% | Cu 6.20% | Be 15.30% | |
| 18 | Zr 39.60% | Ti 33.90% | Nb 7.60% | Cu 6.40% | Be 12.50% | |
| 19 | Cu 47.00% | Ti 34.00% | Zr 11.00% | Ni 8.00% | | |
| 20 | Zr 55.00% | Co 25.00% | Al 20.00% | | | |

Other exemplary ferrous metal-based alloys include compositions such as those disclosed in U.S. Patent Application Publication Nos. 2007/0079907 and 2008/0118387. These compositions include the Fe(Mn, Co, Ni, Cu) (C, Si, B, P, Al) system, wherein the Fe content is from 60 to 75 atomic percentage, the total of (Mn, Co, Ni, Cu) is in the range of from 5 to 25 atomic percentage, and the total of (C, Si, B, P, Al) is in the range of from 8 to 20 atomic percentage, as well as the exemplary composition Fe48Cr15Mo14Y2C15B6. They also include the alloy systems described by Fe—Cr—Mo—(Y,Ln)-C—B, Co—Cr—Mo-Ln-C—B, Fe—Mn—Cr—Mo—(Y,Ln)-C—B, (Fe, Cr, Co)—(Mo,Mn)—(C,B)—Y, Fe—(Co,Ni)—(Zr,Nb,Ta)—(Mo,W)—B, Fe—(Al,Ga)—(P,C,B,Si,Ge), Fe—(Co, Cr,Mo,Ga,Sb)—P—B—C, (Fe, Co)—B—Si—Nb alloys, and Fe—(Cr—Mo)—(C,B)—Tm, where Ln denotes a lanthanide element and Tm denotes a transition metal element. Furthermore, the amorphous alloy can also be one of the exemplary compositions Fe80P12.5C5B2.5, Fe80P11C5B2.5Si1.5, Fe74.5Mo5.5P12.5C5B2.5, Fe74.5Mo5.5P11C5B2.5Si1.5, Fe70Mo5Ni5P12.5C5B2.5, Fe70Mo5Ni5P11C5B2.5Si1.5, Fe68Mo5Ni5Cr2P12.5C5B2.5, and Fe68Mo5Ni5Cr2P11C5B2.5Si1.5, described in U.S. Patent Application Publication No. 2010/0300148.

The amorphous alloys can also be ferrous alloys, such as (Fe, Ni, Co) based alloys. Examples of such compositions are disclosed in U.S. Pat. Nos. 6,325,868; 5,288,344; 5,368,659; 5,618,359; and 5,735,975, Inoue et al., Appl. Phys. Lett., Volume 71, p 464 (1997), Shen et al., Mater. Trans., JIM, Volume 42, p 2136 (2001), and Japanese Patent Application No. 200126277 (Pub. No. 2001303218 A). One exemplary composition is Fe72Al5Ga2P11C6B4. Another example is Fe72Al7Zr10Mo5W2B15. Another iron-based alloy system that can be used in the coating herein is disclosed in U.S. Patent Application Publication No. 2010/0084052, wherein the amorphous metal contains, for example, manganese (1 to 3 atomic %), yttrium (0.1 to 10 atomic %), and silicon (0.3 to 3.1 atomic %) in the range of composition given in parentheses; and that contains the following elements in the specified range of composition given in parentheses: chromium (15 to 20 atomic %), molybdenum (2 to 15 atomic %), tungsten (1 to 3 atomic %), boron (5 to 16 atomic %), carbon (3 to 16 atomic %), and the balance iron.

The aforedescribed amorphous alloy systems can further include additional elements, such as additional transition metal elements, including Nb, Cr, V, and Co. The additional elements can be present at less than or equal to about 30 wt %, such as less than or equal to about 20 wt %, such as less than or equal to about 10 wt %, such as less than or equal to about 5 wt %. In one embodiment, the additional, optional element is at least one of cobalt, manganese, zirconium, tantalum, niobium, tungsten, yttrium, titanium, vanadium and hafnium to form carbides and further improve wear and corrosion resistance. Further optional elements may include phosphorous, germanium and arsenic, totaling up to about 2%, and preferably less than 1%, to reduce melting point. Otherwise incidental impurities should be less than about 2% and preferably 0.5%.

TABLE 1

Exemplary amorphous alloy compositions

| Alloy | Atm % | Atm % | Atm % | Atm % | Atm % | Atm % |
|---|---|---|---|---|---|---|
| 1 | Zr 41.20% | Ti 13.80% | Cu 12.50% | Ni 10.00% | Be 22.50% | |
| 2 | Zr 44.00% | Ti 11.00% | Cu 10.00% | Ni 10.00% | Be 25.00% | |
| 3 | Zr 56.25% | Ti 11.25% | Cu 6.88% | Ni 5.63% | Nb 7.50% | Be 12.50% |
| 4 | Zr 64.75% | Ti 5.60% | Cu 14.90% | Ni 11.15% | Al 2.60% | Be 1.00% |
| 5 | Zr 52.50% | Ti 5.00% | Cu 17.90% | Ni 14.60% | Al 10.00% | |
| 6 | Zr 57.00% | Nb 5.00% | Cu 15.40% | Ni 12.60% | Al 10.00% | |
| 7 | Zr 50.75% | Cu 36.23% | Ni 4.03% | Al 9.00% | Sn 0.50% | |
| 8 | Zr 46.75% | Ti 8.25% | Cu 7.50% | Ni 10.00% | Be 27.50% | |
| 9 | Zr 21.67% | Ti 43.33% | Ni 7.50% | Be 27.50% | | |
| 10 | Zr 35.00% | Ti 30.00% | Cu 7.50% | Be 27.50% | | |
| 11 | Zr 35.00% | Ti 30.00% | Co 6.00% | Be 29.00% | | |
| 12 | Au 49.00% | Ag 5.50% | Pd 2.30% | Cu 26.90% | Si 16.30% | |
| 13 | Au 50.90% | Ag 3.00% | Pd 2.30% | Cu 27.80% | Si 16.00% | |
| 14 | Pt 57.50% | Cu 14.70% | Ni 5.30% | P 22.50% | | |

TABLE 1-continued

Exemplary amorphous alloy compositions

| Alloy | Atm % | Atm % | Atm % | Atm % | Atm % | Atm % |
|---|---|---|---|---|---|---|
| 15 | Zr 36.60% | Ti 31.40% | Nb 7.00% | Cu 5.90% | Be 19.10% | |
| 16 | Zr 38.30% | Ti 32.90% | Nb 7.30% | Cu 6.20% | Be 15.30% | |
| 17 | Zr 39.60% | Ti 33.90% | Nb 7.60% | Cu 6.40% | Be 12.50% | |
| 18 | Cu 47.00% | Ti 34.00% | Zr 11.00% | Ni 8.00% | | |
| 19 | Zr 55.00% | Co 25.00% | Al 20.00% | | | |

Other exemplary ferrous metal-based alloys include compositions such as those disclosed in U.S. Patent Application Publication Nos. 2007/0079907 and 2008/0118387. These compositions include the Fe(Mn, Co, Ni, Cu) (C, Si, B, P, Al) system, wherein the Fe content is from 60 to 75 atomic percentage, the total of (Mn, Co, Ni, Cu) is in the range of from 5 to 25 atomic percentage, and the total of (C, Si, B, P, Al) is in the range of from 8 to 20 atomic percentage, as well as the exemplary composition $Fe_{48}Cr_{15}Mo_{14}Y_2C_{15}B_6$. They also include the alloy systems described by Fe—Cr—Mo—(Y,Ln)-C—B, Co—Cr—Mo-Ln-C—B, Fe—Mn—Cr—Mo—(Y,Ln)-C—B, (Fe, Cr, Co)—(Mo,Mn)—(C,B)—Y, Fe—(Co,Ni)—(Zr,Nb,Ta)—(Mo,W)—B, Fe—(Al,Ga)—(P, C,B,Si,Ge), Fe—(Co, Cr,Mo,Ga,Sb)—P—B—C, (Fe, Co)—B—Si—Nb alloys, and Fe—(Cr—Mo)—(C,B)—Tm, where Ln denotes a lanthanide element and Tm denotes a transition metal element. Furthermore, the amorphous alloy can also be one of the exemplary compositions $Fe_{80}P_{12.5}C_5B_{2.5}$, $Fe_{80}P_{11}C_5B_{2.5}Si_{1.5}$, $Fe_{74.5}Mo_{5.5}P_{12.5}C_5B_{2.5}$, $Fe_{74.5}Mo_{5.5}P_{11}C_5B_{2.5}Si_{1.5}$, $Fe_{70}Mo_5Ni_5P_{12.5}C_5B_{2.5}$, $Fe_{70}Mo_5Ni_5P_{11}C_5B_{2.5}Si_{1.5}$, $Fe_{68}Mo_5Ni_5Cr_2P_{12.5}C_5B_{2.5}$, and $Fe_{68}Mo_5Ni_5Cr_2P_{11}C_5B_{2.5}Si_{1.5}$, described in U.S. Patent Application Publication No. 2010/0300148. Some additional examples of amorphous alloys of different systems are provided in Table 2.

TABLE 2

Exemplary amorphous alloy compositions

| Alloy | Atm % | Atm % | Atm % | Atm % | Atm % | Atm % | Atm % |
|---|---|---|---|---|---|---|---|
| 1 | Fe 68.00% | Mo 5.00% | Ni 5.00% | Cr 2.00% | P 12.50% | C 5.00% | B 2.50% |
| 2 | Fe 68.00% | Mo 5.00% | Ni 5.00% | Cr 2.00% | P 11.00% | C 5.00% | B 2.50% | Si 1.50% |
| 3 | Pd 44.48% | Cu 32.35% | Co 4.05% | P 19.11% | | | |
| 4 | Pd 77.50% | Ag 6.00% | Si 9.00% | P 7.50% | | | |
| 5 | Pd 79.00% | Ag 3.50% | Si 9.50% | P 6.00% | Ge 2.00% | | |
| 6 | Pt 74.70% | Cu 1.50% | Ag 0.30% | P 18.0% | B 4.00% | Si 1.50% | |

In some embodiments, a composition having an amorphous alloy can include a small amount of impurities. The impurity elements can be intentionally added to modify the properties of the composition, such as improving the mechanical properties (e.g., hardness, strength, fracture mechanism, etc.) and/or improving the corrosion resistance. Alternatively, the impurities can be present as inevitable, incidental impurities, such as those obtained as a byproduct of processing and manufacturing. The impurities can be less than or equal to about 10 wt %, such as about 5 wt %, such as about 2 wt %, such as about 1 wt %, such as about 0.5 wt %, such as about 0.1 wt %. In some embodiments, these percentages can be volume percentages instead of weight percentages. In one embodiment, the alloy sample/composition consists essentially of the amorphous alloy (with only a small incidental amount of impurities). In another embodiment, the composition includes the amorphous alloy (with no observable trace of impurities).

Electronic Devices

The embodiments herein can be valuable in the fabrication of electronic devices using a BMG. An electronic device herein can refer to any electronic device known in the art. For example, it can be a telephone, such as a cell phone, and a land-line phone, or any communication device, such as a smart phone, including, for example an iPhone™, and an electronic email sending/receiving device. It can be a part of a display, such as a digital display, a TV monitor, an electronic-book reader, a portable web-browser (e.g., iPad™), and a computer monitor. It can also be an entertainment device, including a portable DVD player, conventional DVD player, Blue-Ray disk player, video game console, music player, such as a portable music player (e.g., iPod™), etc. It can also be a part of a device that provides control, such as controlling the streaming of images, videos, sounds (e.g., Apple TV™), or it can be a remote control for an electronic device. It can be a part of a computer or its accessories, such as the hard drive tower housing or casing, laptop housing, laptop keyboard, laptop track pad, desktop keyboard, mouse, and speaker. The article can also be applied to a device such as a watch or a clock.

Embodiments

The embodiments make use of the differences in the thermal emissivity between crystalline and amorphous phases. Thus, the methods described herein are capable of determining the amorphicity (or percentage of amorphous phase) of a specimen by preparing a specimen of a bulk-solidifying amorphous alloy comprising at least one cross section of the alloy, irradiating at least one surface of the specimen with passive radiation; imaging the irradiated surface with an infrared camera or detector to provide a thermal image, or thermogram; evaluating the differences in emissivity in the thermal image; and determining the percentage of amorphous phase based on the differences in emissivity in the thermal image.

Another embodiment provides an apparatus for determining an unknown degree of amorphicity; the apparatus including a specimen preparation mechanism capable of preparing a specimen comprising at least one cross section of a bulk-solidifying amorphous alloy. The apparatus also includes a passive radiation source to passively irradiate at least one surface of the specimen, and an imaging mechanism capable of imaging the irradiated surface and providing a thermal image or thermogram of the irradiated surface. The apparatus further includes an analyzer that analyzes the thermal image to evaluate the differences in emissivity in the thermal image and determines the percentage of amorphicity based on the differences in emissivity in the thermal image.

It is known that the electrical resistivity of an amorphous phase differs from the electrical resistivity of a crystalline phase of the same material. Most amorphous alloys exhibit a rather significant change in the electrical resistivity when they crystallize. Haruyama, O., et al., "Electrical Resistivity Behavior in Pd—Cu—Ni—P Metallic Glasses and Liquids," Mater. Sci. Eng.: A, Vol. 375-377, pp 288-291 (2004). Electrical resistivity (p) (also known as resistivity, specific electrical resistance, or volume resistivity) is a measure of how strongly a material opposes the flow of electric current. A low resistivity indicates a material that readily allows the movement of electrical charge. The SI unit of electrical resistivity is ohm-meter (em). Resistivity is an intrinsic property of a material and thus is geometrically independent. Electrical resistance (R), on the other hand, depends on the geometry of the material. For example, in one embodiment, electrical resistance is inversely proportional to the cross-sectional area of a wire but is directly proportional to the length of the wire. In other words, a short wire would have a smaller electrical resistance than a lower wire, whereas a wire with a small cross-sectional area would have a larger electrical resistance than one with a large cross-sectional area.

In general, electrical resistivity of crystalline metals and their alloys increases with temperature, while the resistivity of semiconductors decreases with increasing temperature. In both cases, electron-phonon interactions can play an important role. At high temperatures, the resistance of a metal increases linearly with temperature. As the temperature of a metal is reduced, the temperature dependence of resistivity follows a power law function of temperature. Mathematically, the temperature dependence of the resistivity ρ of a metal is given by the Bloch-Gruneisen formula:

$$\rho(T) = \rho(0) + A\left(\frac{T}{\Theta_R}\right)^n \int_0^{\frac{\Theta_R}{T}} \frac{x^n}{(e^x - 1)(1 - e^{-x})} dx$$

where ρ(0) is the residual resistivity due to defect scattering, A is a constant that depends on the velocity of electrons at the Fermi surface, the Debye radius and the number density of electrons in the metal. ΘR is the Debye temperature as obtained from resistivity measurements and matches very closely with the values of Debye temperature obtained from specific heat measurements. n is an integer that depends upon the nature of interaction: n=5 implies that the resistance is due to scattering of electrons by phonons (as it is for simple metals); n=3 implies that the resistance is due to s-d electron scattering (as is the case for transition metals); n=2 implies that the resistance is due to electron-electron interaction.

As the temperature of the metal is sufficiently reduced (so as to "freeze" all the phonons), the electrical resistivity usually reaches a constant value, known as the "residual resistivity." This value depends not only on the type of metal, but on its purity and thermal history. The value of the residual resistivity of a metal can be decided by its impurity concentration. Some materials lose all electrical resistivity at sufficiently low temperatures, due to an effect known as superconductivity.

In contrast to crystalline metals and metal alloys, metallic glasses behave quite differently with respect to the electrical resistivity. For example, in crystalline metal alloys the electrical resistance increases linearly with rising temperature, whereas in amorphous alloys, the electrical resistance does not significantly change, or even show a decrease, with increasing temperature until crystallization takes place. It is commonly known that a metallic glass exhibits an electrical resistivity that remains fairly constant or decreases with increasing temperature (i.e., a small and often negative temperature coefficient), whereas its crystalline counterpart has a large and positive temperature coefficient or resistivity. Further, the electrical resistivity (□) of metallic glasses can be larger than that of a crystalline alloy. For example, the □ of metallic glasses can range from about 100 to about 250 □Ω·cm and can vary smoothly and continuously as the glass transition at Tg is traversed. By contrast, crystalline metal alloys can have a much smaller resistivity (e.g., 1-50 □Ω·cm) and a larger and more positive temperature coefficient.

For example, for a Zr-based alloy, the crystallization temperature (Tx) can be at around 750 K. Thus, in a □ vs. T plot of such an alloy, the curve would appear relatively flat horizontally until 750 K, at which crystallization occurs. At this point, the curve dramatically changes, reflecting crystallization. This change in resistivity results in a change in thermal emissivity. Olk, et al., "Combinatorial Preparation and Infrared Screening of Hydrogen Sorbing Metal Alloys," J. App. Phys., Vol. 94, pp. 720-725 (2003).

Emissivity is a term representing a material's ability to emit thermal radiation. Each material has a different emissivity, and a material's emissivity can range from a theoretical 0.00 (completely not-emitting) to an equally-theoretical 1.00 (completely emitting). The emissivity often varies with temperature. An example of a substance with low emissivity would be silver, with an emissivity coefficient of about 0.02. An example of a substance with high emissivity would be asphalt, with an emissivity coefficient of about 0.98.

A black body is a theoretical object that will radiate infrared radiation at its contact temperature. If a thermocouple on a black body radiator reads 50° C., the radiation the black body will give up will also be 50° C. Therefore a true black body will have an emissivity of 1. Since there is no such thing as a perfect black body, the infrared radiation of normal objects will appear to be less than the contact temperature. The rate (percentage) of emission of infrared radiation will thus be a fraction of the true contact temperature. This fraction is called emissivity. Some objects have different emissivities in long wave as compared to mid wave emissions. Emissivities may also change as a function of temperature in some materials. The methods described herein are useful in measuring only the amorphicity of a sample, and consequently, the value of the emissivity does not need to be calculated, nor does the temperature of the sample. Rather, the difference in emissivities between the crystalline phase and amorphous phase will be apparent when view with an infrared imaging camera or other infrared detection device. For example, the crystalline phase of the sample will appear as a darker portion of the image.

Figure 3:
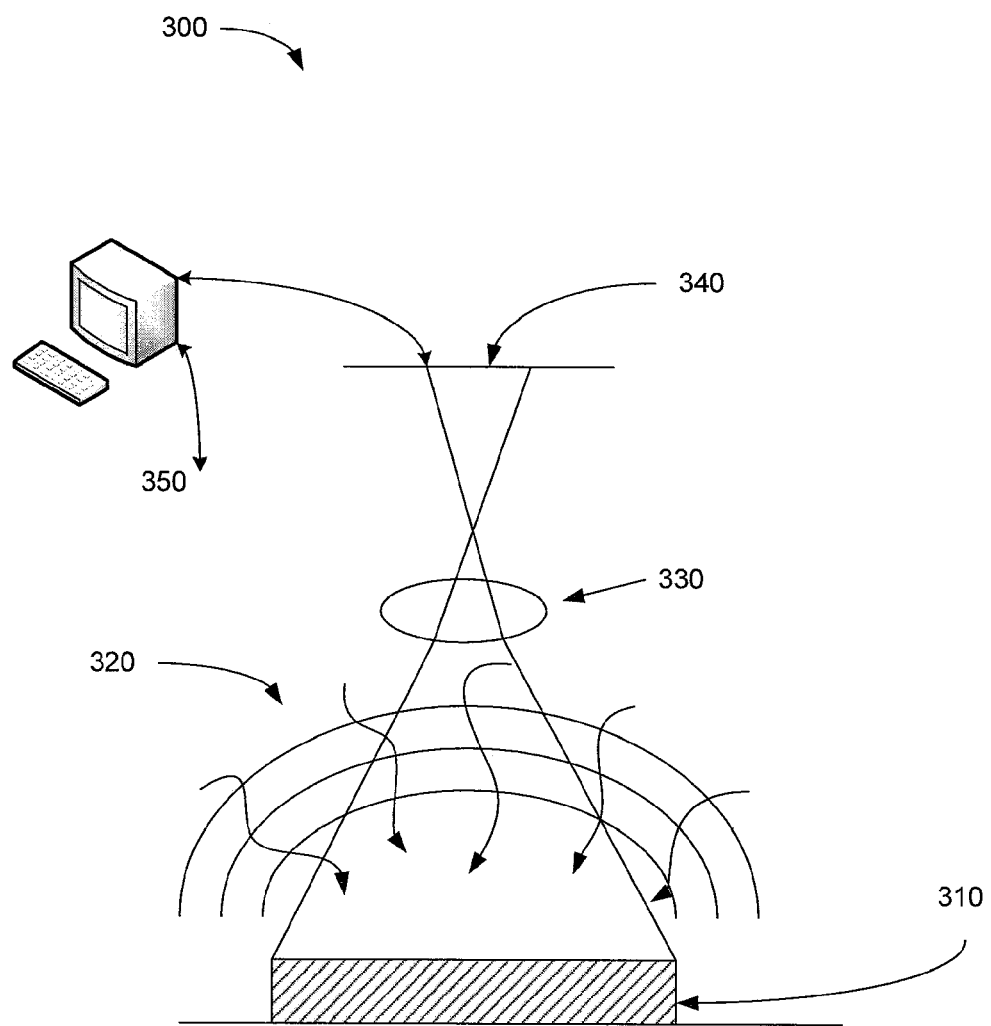
FIG. 3 is a schematic of an apparatus that can be used to provide an infrared image of a thermally heated surface of a specimen to detect thermal emissivity.

The emissivity can be measured using an apparatus similar to that shown in FIG. 3. The visible differences then can be seen upon thermally imaging the surface irradiated with radiation. As shown in FIG. 3, apparatus 300 is capable of capturing a thermal image of a specimen surface that has been irradiated, and processing that image to calculate the percentage of crystalline phase. The amorphicity is simply 100%—% crystalline phase, assuming that the bulk-solidifying amorphous alloy only includes an amorphous phase and a crystalline phase.

The specimen 310 can be prepared by obtaining a bulk-solidifying amorphous alloy material, and obtaining a cross-section of the material such that the surface is substantially flat and smooth. Any mechanism capable of preparing at least one cross-section, and preferably 2 or more cross-sections can be used to prepare the specimen 310. In one embodiment, the mechanism is a laser etching or cutting device that can provide a substantially uniform cut through the material to prepare the cross-section.

The emissivity can be recorded by firing a pulsed laser of monitored output energy (Lo), shown as reference number 320 in FIG. 3 to the specimen 310, and measuring the reflected laser energy (Lr). In one embodiment, the radiation 320 is transmitted to specimen 310 in the form of a hemisphere to assure adequate and substantially equivalent radiation across the surface. Assuming that no energy is transmitted through the specimen 310, the impinging energy (Lo) must either be absorbed or reflected. The unknown absorbed energy (La) can be calculated from the two measured quantities outgoing energy (Lo) and reflected energy (Lr) in accordance with the following equation:

$$La=Lo-L$$

Absorptivity (a) and reflectivity (r) of the target are the normalized values of this equation:

$$a=La/Lo=1-Lr/Lo=1-r$$

Since absorptivity (a) and emissivity (e) are equal the emissivity of the specimen 310 (e) of the specimen 310 is known as soon as the absorptivity (a) is known.

$$e=a=1-r$$

The above equations hold true for the total hemispherical integral of the reflected energy (r). As the instruments optical sensor path captures only a small solid angle from the total hemisphere, it is preferred that the specimen have a Lambertian surface reflecting homogeneously into a hemisphere. Small specular portions are acceptable as long as it avoids the specular reflected energy from hitting the receiving channel. The provided optics 330 guarantees this if mounted with its axis perpendicular to the target surface, as shown in FIG. 3.

Upon heating the specimen 310 to a suitable temperature by subjecting the specimen to radiation 320, the surface of the specimen can be imaged with an infrared camera 330 or any suitable device capable of capturing a thermal image of a surface. Any infrared camera device can be used in the embodiments, including those available from FLIR systems, Boston, Mass., Sierra Pacific Innovation Corp. (SPI), Las Vegas, Nev., Infrared Cameras, Inc., Beaumont, Tex., and the like. The camera 330 can be an indium gallium arsenide (InGaAs) short wave infrared camera (SWIR), InSb, HgCdTe, or a quantum well infrared photodetector (QWIP), all of which rely on specialized focal plane arrays (FPAs). The camera 330 can be mounted as shown in FIG. 3, can be hand held, or can be in the form of an application on a smartphone or handheld personal data assistant or mobile phone.

Figure 4:
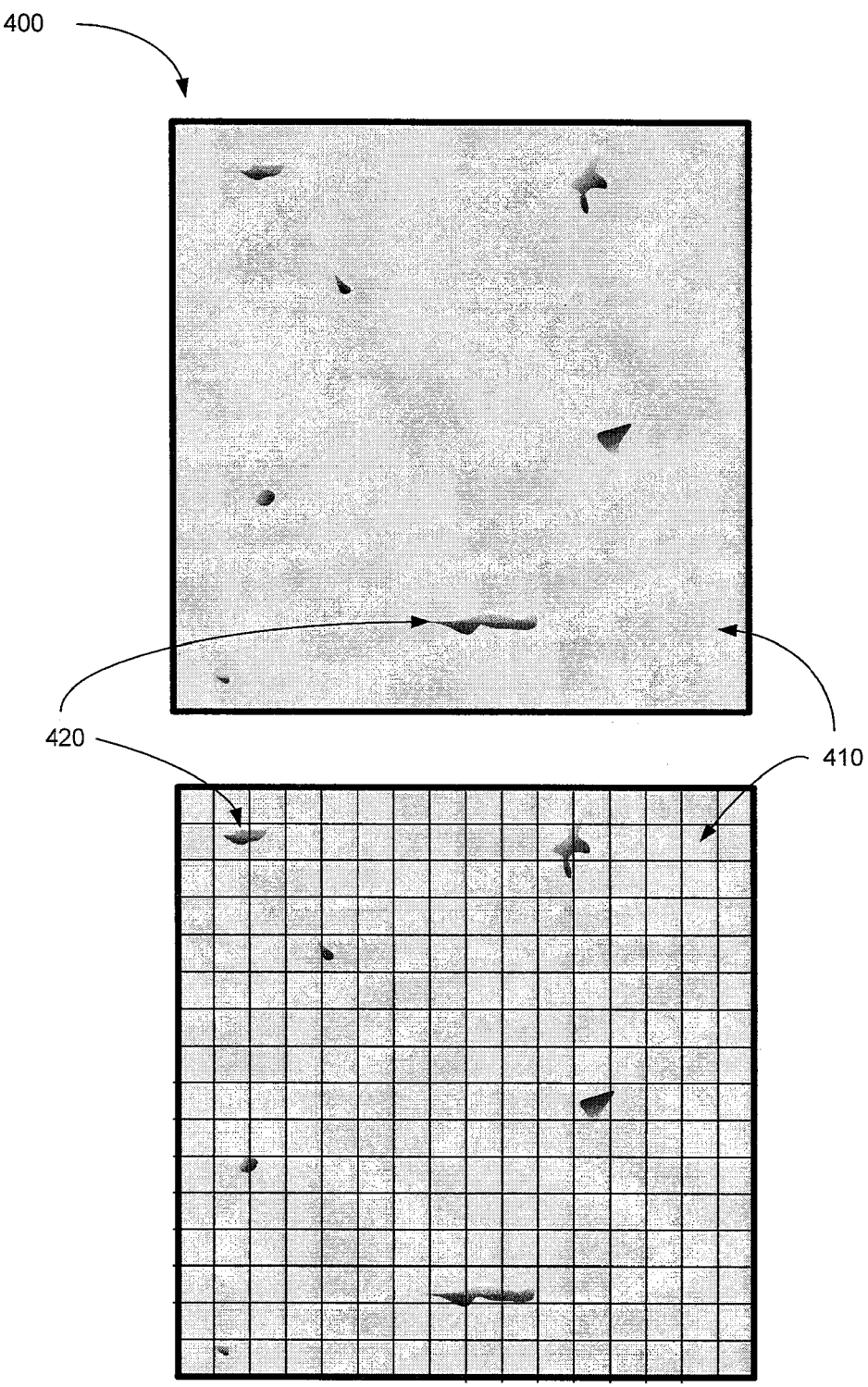
FIG. 4 is a representation of an infrared image of a bulk-solidifying amorphous alloy specimen showing small areas of crystallinity, and showing a grid useful in determining the amount of amorphicity of the specimen.

The image captured by the thermal imaging device 330 can be displayed at 340 and printed out, or stored on a computer storable medium 350, such as a personal computer, hard drive, or other storage device, handheld storage device, and the like. Most image capturing thermal imaging devices are provided with algorithms that convert the thermal image into a computer recognizable format, such as a bit map, jpeg, tiff, png, gif, or other readily processible format. An exemplary thermal image of a section of a bulk-solidifying amorphous alloy having amorphous and crystalline phases is shown in FIG. 4. The thermal image then can be analyzed to determine the percentage of crystalline material in the sample, which can be used to determine the amorphicity (amorphicity=1−crystallinity).

The crystalline phase of a bulk-solidifying amorphous alloy material will provide a different image tone due to its different thermal emissivity than the image tone of the amorphous material. These different tones can be seen in FIG. 4. As shown in FIG. 4, crystalline phases are represented by 420, and the amorphous phase is represented by 410. An image analysis can be carried out either by hand, or calculated automatically by scanning the entire image, creating a grid as shown in the bottom of FIG. 4, assessing the differences between successive pixels on the image (where a set point difference can be used to indicate a different material), and calculating the percentage of pixels having a certain differences from a baseline. Numerous software packages are available that can calculate the different colors in an image, as well as determining the color value for any given pixel in an image file. Those skilled in the art will be capable of determining the percentage of crystalline phase 420 in a thermographic image similar to that shown in FIG. 4.

The grid in FIG. 4, which is shown as a 16×16 grid, can be used to determine the percentage of area taken up by the crystalline phase 420. The total area taken up by the crystalline phase 420 encompasses about 3-4 grids, which results in a crystallinity on the order of 1.2-1.5%, or an amorphicity of 98.5% to 98.8%. The same process can be carried out on different sections of the same bulk-solidifying amorphous alloy part and the results combined and averaged to provide a more accurate representation of the amorphicity of the sample. The entire process could be automated, and if the degree of amorphicity is outside an acceptable range, that information could be fed back to a process control system to adjust the processing parameters to bring the product back in line with quality control specifications.

As stated above, an apparatus that can carry out the aforedescribed methods can be employed as a quality control apparatus, which can be integrated with the metallic glass fabrication system. The apparatus can section the product into 2, 3, or more sections, then subject each section to radiation, thermally image each irradiated section, and then determine the percentage of crystalline phase in the sample, and provide an indication as to whether the product had an acceptable amount of crystalline phase. For example, if the indicator in the apparatus shows a "bad" signal, e.g., amorphicitiy below a certain level, such as below about 95%, the apparatus can send a signal to the fabrication system to either stop the process, or to divert products until the apparatus provides a "pass" signal (e.g., amorphicity above about 95%). Alternatively, the signal can be sent to the fabrication system to modify the fabrication conditions (e.g., temperature, pressure, etc.) to optimize the quality of the product. The quality control feedback of the system integrated with the apparatus can be continuous—i.e., the feedback is continuously sent and received by the fabrication system and adjustments are made continuously. Alternatively, the feedback can be discrete—i.e., the signal is sent at a specified time and the fabrication system can be monitored and examined then based on the feedback.

Furthermore, instead of a binary "pass" or "bad" determination, the presently described methods can be used to describe directly the levels/degrees of amorphicity. In one embodiment, such post-processing/fabricating determination can provide feedback in the fabrication process such that the fabrication parameters can be adjusted to optimize the product quality. In one embodiment, the entire process that includes fabrication, quality monitoring, and parameter adjustment can be automated, i.e., controlled by computer.

The aforedescribed quality control can be valuable in the fabrication process involving using BMG. Because of the superior properties of BMG, BMG can be made into structural components in a variety of devices and parts. One such type of device is an electronic device.

An electronic device herein can refer to any electronic device known in the art. For example, it can be a telephone, such as a cell phone, and a land-line phone, or any communication device, such as a smart phone, including, for example an iPhone™, and an electronic email sending/receiving device. It can be a part of a display, such as a digital display, a TV monitor, an electronic-book reader, a portable web-browser (e.g., iPad™), and a computer monitor. It can also be an entertainment device, including a portable DVD player, conventional DVD player, Blue-Ray disk player, video game console, music player, such as a portable music player (e.g., iPod™), etc. It can also be a part of a device that provides control, such as controlling the streaming of images, videos, sounds (e.g., Apple TV™), or it can be a remote control for an electronic device. It can be a part of a computer or its accessories, such as the hard drive tower housing or casing, laptop housing, laptop keyboard, laptop track pad, desktop keyboard, mouse, and speaker. The article can also be applied to a device such as a watch or a clock.

The articles "a" and "an" are used herein to refer to one or to more than one (i.e., to at least one) of the grammatical object of the article. By way of example, "a bulk-solidifying amorphous alloy" means one alloy or more than one alloy. Any ranges cited herein are inclusive. The terms "substantially" and "about" used throughout this specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

What is claimed:

1. A method of determining the amorphicity of a specimen comprising:
    preparing a specimen of a bulk-solidifying amorphous alloy to include at least one cross section of the alloy;
    irradiating at least one surface of the specimen with passive radiation;
    imaging the at least one irradiated surface with a detector to provide a thermal image;
    evaluating the differences in emissivity in the thermal image; and
    determining the percentage of amorphous phase based on the differences in emissivity in the thermal image.

2. The method of claim 1, wherein the alloy comprises Zr, Hf, Ti, Cu, Ni, Pt, Pd, Fe, Mg, Au, La, Ag, Al, Mo, Nb, Be, or combinations thereof.

3. The method of claim 1, wherein irradiating at least one surface comprises subjecting the surface to a hemispherical infrared irradiation.

4. The method of claim 1, wherein the detector is a thermal imaging camera.

5. The method of claim 1, wherein the thermal image is in the form of a computer readable image format.

6. The method of claim 1, wherein evaluating the differences in emissivity in the thermal image comprises determining the differences in color in the thermal image, wherein different colors represent different thermal emissivities.

7. The method of claim 6, wherein the determining the percentage of amorphous phase comprises determining the percentage of crystalline phase by calculating the percentage of color that corresponds to the thermal emissivity of crystalline phase, and subtracting that percentage from one to determine the amorphicity.

8. The method of claim 1, further comprising carrying out the method on three different specimens of the same bulk-solidifying amorphous alloy, and averaging the amorphicity.

9. The method as claimed in claim 1, wherein the bulk-solidifying amorphous alloy is described by the following molecular formula: $(Zr, Ti)_a(Ni, Cu, Fe)_b(Be, Al, Si, B)_c$, wherein "a" is in the range of from 30 to 75, "b" is in the range of from 5 to 60, and "c" is in the range of from 0 to 50 in atomic percentages.

10. The method as claimed in claim 1, wherein the bulk-solidifying amorphous alloy is described by the following molecular formula: $(Zr, Ti)_a(Ni, Cu)_b(Be)_c$, wherein "a" is in the range of from 40 to 75, "b" is in the range of from 5 to 50, and "c" is in the range of from 5 to 50 in atomic percentages.

11. An apparatus for determining an unknown degree of amorphicity, comprising:

a specimen preparation mechanism capable of preparing a specimen comprising at least one cross section of a bulk-solidifying amorphous alloy;

a passive radiation source to passively irradiate at least one surface of the specimen;

an imaging mechanism capable of imaging the irradiated surface and providing a thermal image of the irradiated surface; and an analyzer that analyzes the thermal image to evaluate the differences in emissivity in the thermal image and determines the percentage of amorphicity based on the differences in emissivity in the thermal image.

12. The apparatus of claim 11, wherein the apparatus is part of a process control system.

13. The apparatus as claimed in claim 11, wherein the specimen preparation mechanism is a laser cutting device.

14. The apparatus as claimed in claim 11, wherein the imaging mechanism is an infrared thermal imaging camera.

15. The apparatus as claimed in claim 11, wherein the analyzer is a computer having software capable of analyzing different colors in a computer-readable image.

16. The apparatus as claimed in claim 11, wherein the alloy comprises Zr, Hf, Ti, Cu, Ni, Pt, Pd, Fe, Mg, Au, La, Ag, Al, Mo, Nb, Be, or combinations thereof.

17. The apparatus as claimed in claim 16, wherein the bulk-solidifying amorphous alloy is described by the following molecular formula: $(Zr, Ti)_a(Ni, Cu, Fe)_b(Be, Al, Si, B)_c$, wherein "a" is in the range of from 30 to 75, "b" is in the range of from 5 to 60, and "c" is in the range of from 0 to 50 in atomic percentages.

18. The apparatus as claimed in claim 16, wherein the bulk-solidifying amorphous alloy is described by the following molecular formula: $(Zr, Ti)_a(Ni, Cu)_b(Be)_c$, wherein "a" is in the range of from 40 to 75, "b" is in the range of from 5 to 50, and "c" is in the range of from 5 to 50 in atomic percentages.

* * * * *